United States Patent [19]
Pratt et al.

[11] B 4,012,650
[45] Mar. 15, 1977

[54] DICED SUBSTRATE S.A.W. DEVICE FOR BULK WAVE ATTENUATION

[75] Inventors: Ronald George Pratt, Reigate; Richard Stevens, Copthorne; Alojzy Karr, Shoreham by-Sea, all of England

[73] Assignee: U.S. Philips Corporation, New York, N.Y.

[22] Filed: Aug. 29, 1974

[21] Appl. No.: 501,482

[44] Published under the second Trial Voluntary Protest Program on January 13, 1976 as document No. B 501,482.

[30] Foreign Application Priority Data
Sept. 4, 1973 United Kingdom ............ 41479/73

[52] U.S. Cl. .................................. 310/9.6; 310/9.5; 310/9.8; 333/30 R
[51] Int. Cl.² .......................................... H01L 41/04
[58] Field of Search ............ 310/8.1, 9.6, 9.5, 9.7, 310/9.8; 333/30 R, 72

[56] References Cited
UNITED STATES PATENTS

| | | | |
|---|---|---|---|
| 3,283,264 | 11/1966 | Papadakis | 310/9.6 X |
| 3,353,120 | 11/1967 | Tournois | 333/30 R |
| 3,435,381 | 3/1969 | Tournois | 333/30 R |
| 3,458,831 | 7/1969 | Veilex | 310/9.8 X |
| 3,464,033 | 8/1969 | Tournois | 333/30 R |
| 3,573,673 | 4/1971 | De Vries | 333/30 R X |
| 3,678,304 | 7/1972 | Humphryes | 310/9.8 X |
| 3,887,887 | 6/1975 | Wagers et al. | 310/9.5 X |

Primary Examiner—Mark O. Budd
Attorney, Agent, or Firm—Frank R. Trifari; Bernard Franzblau

[57] ABSTRACT

In acoustic surface wave devices the bottom of the substrate is provided with a plurality of discrete recesses to attenuate and/or scatter bulk waves.

13 Claims, 5 Drawing Figures

DICED SUBSTRATE S.A.W. DEVICE FOR BULK WAVE ATTENUATION

The invention relates to an acoustic surface-wave device comprising a body in the form of a wafer in which at least a layer which extends under a first major surface consists of a piezo-electric material, which first major surface serves as an acoustic surface-wave propagation surface and for this purpose is provided with at least one transducer for converting an electric signal into a surface wave or conversely.

The use of acoustic surface waves, such as for example Rayleigh waves, has enabled very compact and robust devices which provide a time delay or a frequency-selective function to be manufactured, while use can be made of techniques for the manufacture of integrated circuits with which the said devices also can be combined. Such devices make it possible to avoid certain difficulties, such as the comparatively large bulk and manufacturing cost associated with the provision of discrete inductors.

The acoustic surface wave is generally launched on a planar acoustic surface wave propagation surface of a piezoelectric body, formed for example from a suitable monocrystal or from a polarised ceramic, by means of an interdigital launching electrode array forming the launching transducer. One or more further interdigital electrode arrays can be arranged in the path of acoustic surface waves propagating from the launching transducer to receive and convert propagating acoustic surface waves back into corresponding electric signals. The device provides a propagation delay equal to the time for an acoustic surface wave to propagate from the launching transducer to a corresponding point in a receiving transducer and this characteristic can be employed to delay a signal. The interdigital electrode array has a periodic structure which, in conjunction with the acoustic surface-wave propagation velocity, can be arranged to provide a desired frequency-selective response, and by suitably arranging the spacing and effective acoustic wave excitations of the interdigital electrode elements of the launching and receiving electrodes, a selective filter having a desired overall pass-band can be constructed. Acoustic surface-wave filters can be employed in the intermediate frequency signal path of telecommunications receivers, such as television receivers, where the associated delay is insignificant.

The functions of time delay and frequency selectivity can be employed in combination for a variety of other purposes such as, for example, the frequency defining element of an oscillator.

A problem with the electric field distribution in an interdigital electrode array is that, in addition to the desired acoustic surface wave, bulk longitudinal and bulk shear waves can also be launched and received, and the wafer can be excited into beam modes of oscillation which also provide a significant undesired output. Beam modes are especially significant in the case of polarised ceramic materials. Bulk waves and beam oscillation modes cause undesired output signals to occur in and outside the desired pass-band and can adversely affect the performance of the device. This is especially so when the frequency-selective properties of the acoustic surface wave transducer arrays are being relied on to provide the sole filtering effect, as in the example of an intermediate frequency amplifier system.

The aforesaid bulk waves can be radiated in various directions by the launching transducer and can be similarly received by the receiving transducer. In a thin wafer-like piezoelectric body such as is frequently employed for acoustic surface-wave devices, bulk waves radiating at an angle to the acoustic surface wave propagation surface can be multiply reflected and can travel from the launching to the receiving transducer in this manner sometimes by means of acoustic wave-guide propagation modes. In addition the wafer may itself resonate in a series of symmetric or antisymmetric plate modes which also transfer signal energy in an undesired manner in the stop-band regions, normally just below the desired intermediate frequency pass-band, and such modes are especially troublesome with polarized piezoelectric ceramic materials.

It is an object of the invention to provide a form of acoustic surface-wave device and an advantageous method of manufacturing said device in which the transfer of energy by the aforesaid undesired modes is readily and effectively reduced.

For this purpose the invention is characterized in that a plurality of discrete recesses are formed in and distributed over at least a portion of the second major surface of the wafer, which recesses extend into the wafer to a distance from the first major surface such that propagation of the acoustic surface waves is substantially unaffected, whereas propagation of bulk waves is significantly affected in an attenuating and/or scattering sense. The said recesses together with the surrounding intermediate areas are provided in a configuration such that any straight line joining any two edges of the said second surface intersects at least one intermediate area.

The invention uses the feature that the amplitude of the wave motion of surface waves internally of the wafer rapidly decreases as a function of the distance from the propagation surface. As a result, the recesses may extend near to the said propagation surface without appreciably disturbing the propagation of the surface waves. On the other hand, the bulk waves which propagate throughout the thickness of the wafer are greatly affected by the said recesses because they will be incident on, and attenuated and/or scattered by, the recesses so that their disturbing influence on the transfer characteristic is considerably reduced. The said resonances also are suppressed by the provision of the recesses.

Providing the recesses involves the real risk, in particular because of the desirability of minimum distance of the deepest point of a recess from the first major surface, that the mechanical strength of the wafer will materially be affected. This risk is largely prevented by the special choice of the configuration of the recesses and the associated intermediate areas. In particular, a configuration is chosen in which no straight line joining any two edges of the second surface is possible which does not intersect an intermediate area. The said choice is based on the recognition that the risk of breakage of a wafer is greatest if there is a recess which extends in a straight line from edge to edge. Such a recess will then form the line of fracture. In other words, the recesses are arranged in a pattern so as to prevent the formation of any straight grooves in the second major surface that might extend between any two edges of the second surface. Because owing to the choice of the configuration of the recesses any possible straight line joining the edges of the second surface passes through at least one intermediate area in which the original thickness of the wafer is retained, any possible line of fracture is reinforced by at least one intermediate area. The optimum solution from a mechanical point of view is obviously obtained by using recesses which have comparatively small cross-sectional areas and are surrounded by comparatively large intermediate areas.

Obviously there is a great freedom of choice in the selection of the shape of the recesses, which may be round, oval, square or rectangular. However, it has been found that with a view to mechanical strength it is of advantage to select a shape such that the ratio between the lengths of any two cross-sections of each recess is not greater than six. With respect to the reduction of the bulk waves and resonances it proved advantageous for the side walls of the recesses to be approximately perpendicular to the first major surface.

Obviously there is some freedom in the choice of the depth of the recesses also. However, preferably the recesses have a depth such that the deepest point is spaced from the first major surface by a distance of between three and five times the wavelength of the surface wave which propagates in the first major surface. Especially when the piezoelectric material used is bismuth silicon oxide and the operational frequency is about 37 MHz, the said values have proved useful.

Obviously instead of bismuth silicon oxide any other piezo-electric single-crystal or polarized ceramic material may be used. Also a layered material may be used, at least the layer adjoining the first major surface being piezoelectric.

Both with respect to the mechanical strength and to the suppression of the undesirable oscillation components it has proved of advantage for the recesses to be provided in the second major surface in the form of a matrix pattern the rows and columns of which are at an angle which differs from 90° to the direction of propagation of the surface waves in the first major surface. The said angle preferably lies between 40° and 50°.

According to a feature of the invention there is provided a method of manufacturing an acoustic surface-wave device embodying the invention which includes the step of the simultaneous formation of at least a large part of the discrete recesses in the said second major surface of the wafer. Preferably the process employs ultrasonic drilling using a slurry of abrasive powder in conjunction with an ultrasonic drill bit having formed thereon a pattern of lands which are separated by slots and correspond to the required pattern of discrete recesses to be formed. This method is rapid in operation, provides recesses having substantially parallel sides perpendicular to the major surface of the wafer and enables the depth of the recesses to be readily controlled. Alternatively the recesses can be formed by using sand-blasting techniques, i.e., by a process of scouring employing abrasive particles carried in a fluid medium directed through apertures in a mask. The abrasive can be carborundum powder carried by a gaseous medium and the mask can take the form of a flattened wire mesh in which the wire diameter can be, for example, 250 μm and the mesh spacing can be 700 μm.

In order that the invention may be clearly understood and readily carried into effect, embodiments thereof will now be described, by way of example, with reference to the accompanying drawing, in which.

Figure 1A:
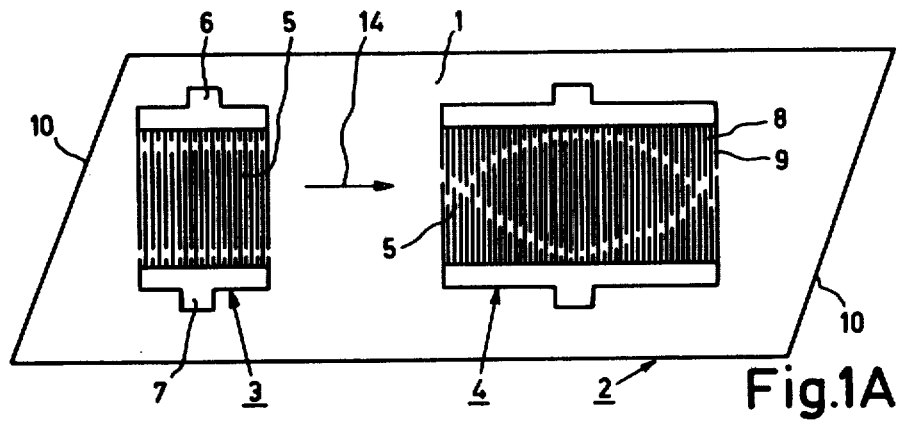
FIGS. 1A and 1B are diagrams, not to scale, illustrating the upper and lower major surfaces of an acoustic surface wave intermediate frequency filter embodying the invention.
Figure 1B:
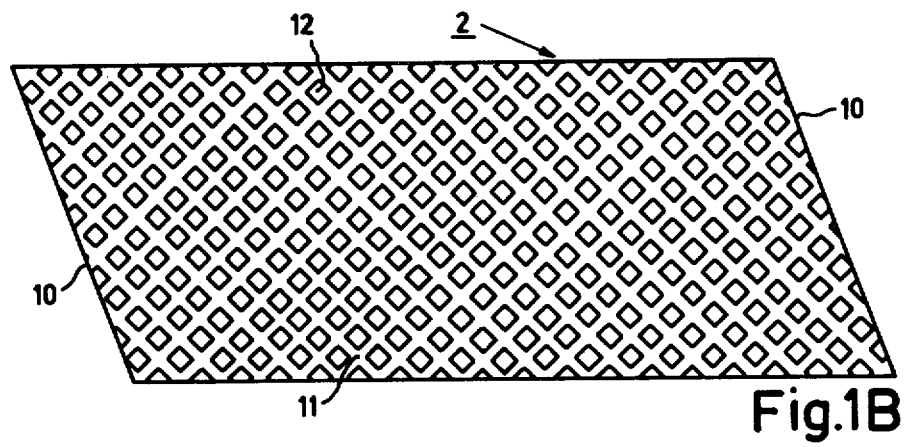

Referring first to FIGS. 1A and 1B, which show two views of an acoustic surface wave intermediate frequency filter operating at 37 MHz and embodying the invention, FIG. 1A is a view of the acoustic surface wave propagation surface 1 formed on one of the major surfaces of a wafer 2 of monocrystalline bismuth silicon oxide. Interdigital launching and receiving transducers 3, 4 are formed thereon in the normal manner from a layer of gold using, for example, the techniques of photolithography. The individual electrode elements 5 of one of the transducers, namely the transducer 3, are all made the same length to simplify the design computation. The lengths of the individual electrode elements 5 of the transducer 4 are varied along the array in order to provide the desired overall filter pass-band response in conjunction with the uniform transducer 3. Dummy electrode portions 9 are introduced to fill the space between adjacent electrode elements connected to the same terminal connection where the interposed element has been shortened, in order to maintain the acoustic surface wave velocity constant across the array and thus to avoid undesired distortion of the beam. The ends 10 of the wafer 2 are cut at an angle of approximately 70° to the acoustic surface wave propagation direction to scatter the unwanted beam radiated by the transducers 3 and 4 and incident on the said ends.

Figure 2:
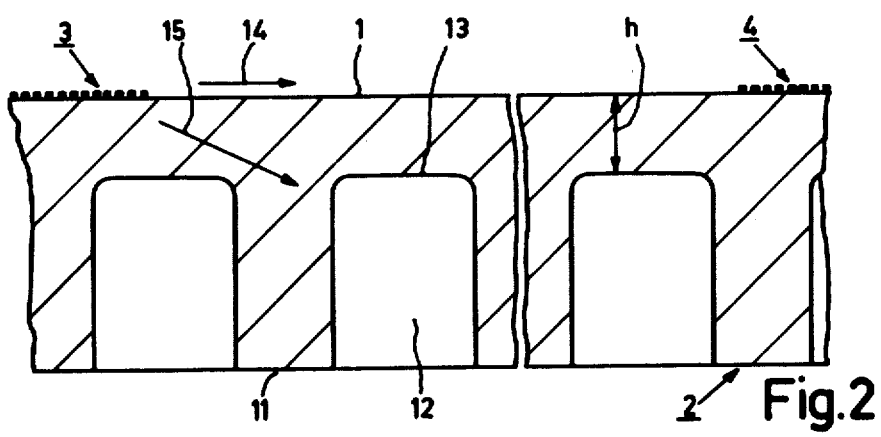
FIG. 2 is an enlarged longitudinal sectional detail, also not to scale, of the filter shown in FIG. 1.

The other major surface 11 of the wafer 2 is illustrated in FIG. 1B. A plurality of discrete recesses 12 are distributed over the surface 11 in a matrix pattern with the rows and columns inclined at approximately 45° to the acoustic surface wave propagation direction 14 on the other major surface 1. In this way, the recesses form a pattern so as to prevent the formation of a straight groove in the second major suface extending between any two edges thereof. Each recess has a cross-section which is approximately square with rounded corners and about 350 μm or 7 λ across, where λ is the wavelength for the operational frequency of 37 MHz of the acoustic surface waves propagating over the surface 1. The recesses are distributed with an approximate centre-to-centre distance of 600 μm or about 12 λ. The inward extremity 13 of each recess 12, shown in the longitudinal sectional detail of FIG. 2, is arranged to be a distance $h$ from the acoustic surface wave propagation surface 1 such that the propagation of desired acoustic surface waves, indicated by the arrow 14, is not adversely affected, but small enough to effectively reduce the energy transmitted from one transducer to the other by bulk waves inclined to the propagation surface 1, such as that indicated by the arrow 15, which are thus caused to be incident on the side wall of the cavity 12 and to be scattered by multiple reflection. Preferably the distance $h$ lies between $3\lambda$ and $5\lambda$ and in the present example is equal to 200 $\mu$m, the overall thickness of the wafer 2 being in the range of 500 to 700 $\mu$m approximately.

Figure 3:
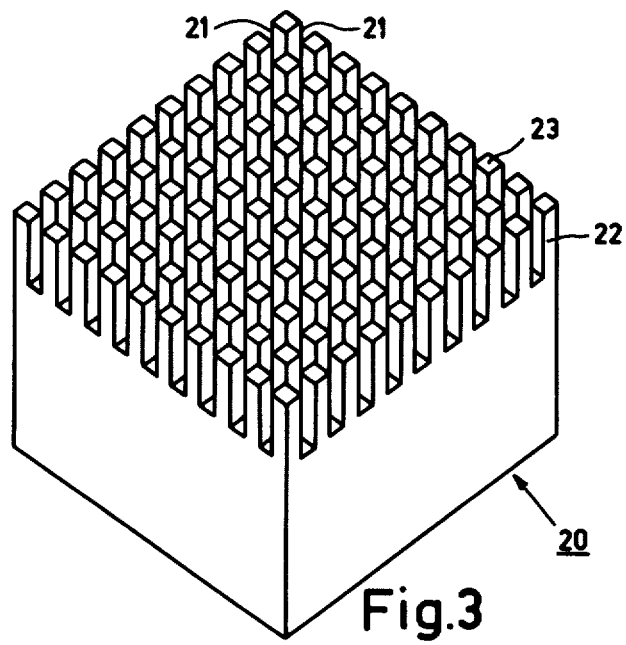
FIG. 3 illustrates the form of an ultrasonic drill bit which may be employed to carry out the preferred method of manufacturing the filter shown in FIG. 1.

In a preferred method of realizing the device according to the invention, the recesses 12 are formed by means of ultrasonic drilling using an ultrasonic drill bit 20 as illustrated in FIG. 3 in conjunction with a suitable abrasive slurry containing for example carborundum or alumina powder of a suitably fine grade. The drill bit 20 is made from a body of suitable material such as, for example, tool steel and a plurality of lands 22 are formed in the abrading surface 23 by making two sets of parallel saw-cuts to a depth of about 1 mm. at right-angles to each other. Each saw-cut forms a slot 300 $\mu$m wide and the cuts in each set are spaced to leave lands 300 $\mu$m wide between adjacent cuts. Ultrasonic drilling is performed on the surface 11 of the wafer until the cavities formed by the lands 22 of the drill extend to a distance of 200 $\mu$m from the surface 1 in the present example. Drilling is preferably carried out before applying the electrodes 3 and 4 to the acoustic surface wave propagation surface 1 to avoid damage thereto. The use of an ultrasonic drill enables the recesses to be formed rapidly and accurately in the manufacture of acoustic surface-wave devices embodying the invention, and enables recesses having substantially parallel sides as indicated in FIG. 2 to be readily produced.

Figure 4:
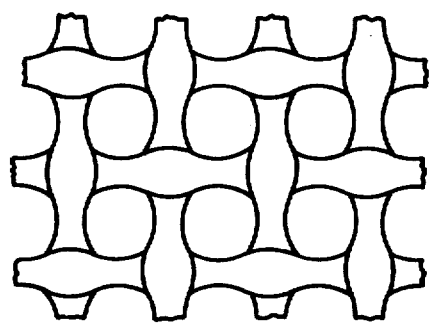
FIG. 4 is a detail of a mesh screen employed in an alternative method of manufacturing an embodiment.
Figure 5:
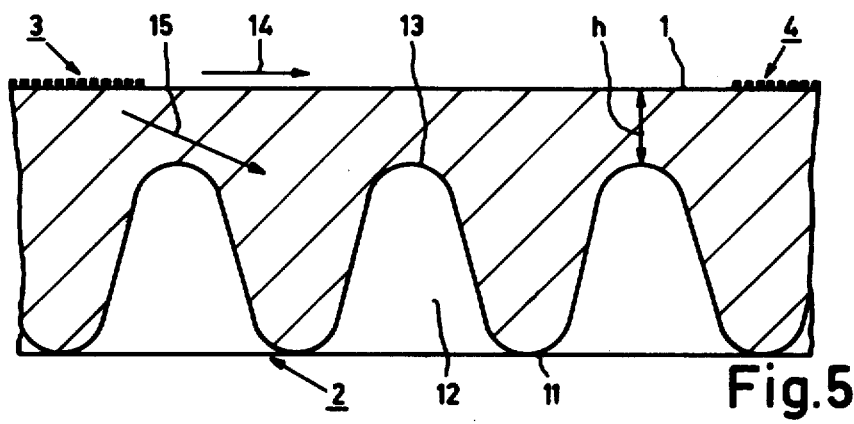
FIG. 5 is an enlarged longitudinal section of an embodiment of the invention manufactured by the alternative method.

An alternative method of forming an array of recesses in the surface 11 of the wafer 2 is by a process of sand-blasting the surface through a mask having apertures corresponding to the desired locations of the recesses, the mask being maintained in contact with the surface of the wafer. A convenient form of mask is a contact mesh, a detail of which is shown in FIG. 4. Before use the contact mesh is carefully flattened between rollers to ensure optimum contact with the surface of the wafer. In the example given of a wafer of bismuth silicon oxide on which is to be formed an intermediate-frequency filter using an acoustic surface-wave wavelength of about 60 $\mu$m, the centre-to-centre spacing of adjacent mesh wires is 700 $\mu$m and the gap between adjacent wires is 450 $\mu$m, the wires themselves being 250 $\mu$m in diameter. The abrasive used is carborundum or alumina powder in a high-velocity stream of a suitable gas such as air or preferably nitrogen. This method will tend to produce recesses with slightly sloping sides as illustrated in the longitudinal sectional view of a portion of a device formed using the present method shown in FIG. 5.

While an embodiment of the invention using bismuth silicon oxide has been described, the invention may be used with advantage with other piezoelectric materials such as bismuth germanium oxide, lithium niobate, quartz and various polarised ceramic piezoelectric materials. The wafer can also be formed so as to provide a layered medium and can comprise one piezoelectric material on another, for example zinc oxide on lithium niobate, or a piezoelectric material on a non-piezoelectric material, for example zinc oxide on silicon.

The dimensions of the recesses, their spacing, distribution and the distance $h$ will depend on the wavelength of the acoustic surface wave employed in the device and also on various physical properties of the materials chosen. The recesses need not be distributed uniformly over the lower surface 11 but may be arranged in a random or non-periodic manner if desired. The recesses must be arranged in the propagation region between a launching and a receiving transducer and can with advantage also be located underneath the transducer electrodes, but may be omitted if desired from regions of the surface 11 which do not contribute significantly to the propagation of bulk waves from one transducer to the other. In the case where plate modes are especially troublesome, for example using polarised ceramics, it may be preferable to distribute the recesses over the whole of the lower area. Alternatively the frequency of some plate mode oscillations can, if desired, be reduced and thus removed in some cases from the desired frequency range by forming the recesses only over the central region of the wafer.

What is claimed is:

1. An acoustic surface-wave device comprising a body in the form of a wafer having a layer extending under a first major surface and made of a piezoelectric material, which first major surface serves as a propagation surface for the acoustic surface waves, a transducer coupled to said first major surface for converting an electric signal into a surface wave or conversely, and a plurality of discrete recesses being formed in and distributed over at least a portion of the second major surface of the wafer, which recesses extend into the wafer to a distance from the first major surface such that propagation of the acoustic surface waves is substantially unaffected whereas propagation of bulk waves is significantly affected in an attenuating and/or scattering sense, the said recesses together with the surrounding intermediate areas being arranged in a configuration such that any straight line which joins any two edges of said second surface intersects at least one intermediate area.

2. A device as claimed in claim 1 wherein the distance of the deepest point of a recess from the first major surface lies between three and five times the wavelength of the surface wave propagating along the first major surface.

3. A device as claimed in claim 1 wherein the ratio between the lengths of any two cross-sections of each recess is not greater than six.

4. A device as claimed in claim 1 wherein the side walls of the recesses extend substantially perpendicular to the first major surface.

5. A device as claimed in claim 1 wherein the recesses are formed in the second major surface in the form of a matrix pattern of rows and columns inclined at an angle other than 90° to the direction of propagation of the surface waves in the first major surface.

6. A device as claimed in claim 5 wherein said angle lies between 40° and 50°.

7. A device as claimed in claim 1 wherein the recesses in the second major surface are formed by ultrasonically drilling said surface.

8. A device as claimed in claim 2 wherein the recesses are arranged in the second major surface in the form of a matrix pattern of rows and columns inclined at an angle other than 90° to the direction of propagation of the surface waves in the first major surface.

9. A device as claimed in claim 8 wherein the side walls of the recesses extend in a direction substantially perpendicular to the first major surface.

10. An acoustic surface wave device comprising a thin body of material capable of supporting acoustic waves, an electroacoustic transducer coupled to a first major surface of said body which serves as the acoustic surface wave propagation surface of the device, and a plurality of discrete recesses formed in and distributed over a portion of a second major surface of the body which is parallel to the first major surface, said recesses extending into the body in a direction towards the first major surface for a distance such that propagation of acoustic surface waves is substantially unaffected whereas the propagation of bulk acoustic waves is substantially inhibited, said recesses being arranged in a pattern to prevent the formation of any straight grooves in said second major surface extending between any two edges of the second major surface.

11. A device as claimed in claim 10 wherein said body is formed of at least two adjacent layers of dissimilar materials with one layer forming said first major surface and comprising a piezoelectric material.

12. A device as claimed in claim 10 wherein the recesses extend into the body in a direction perpendicular to the first major surface to a point spaced from the first major surface that lies between three and five times the wavelength of the acoustic surface wave to be propagated along said first major surface.

13. A device as claimed in claim 10 wherein the recesses are arranged in a matrix pattern of rows and columns inclined at an acute angle to the propagation direction of the acoustic surface waves in the first major surface.

* * * * *